(12) United States Patent
Ma et al.

(10) Patent No.: US 11,538,986 B2
(45) Date of Patent: Dec. 27, 2022

(54) ASYMMETRIC ENGINEERED STORAGE LAYER OF MAGNETIC TUNNEL JUNCTION ELEMENT FOR MAGNETIC MEMORY DEVICE

(71) Applicant: HeFeChip Corporation Limited, Sai Ying Pun (HK)

(72) Inventors: Qinli Ma, Mt Kisco, NY (US); Wei-Chuan Chen, Scarsdale, NY (US); Shu-Jen Han, Armonk, NY (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 261 days.

(21) Appl. No.: 16/848,846

(22) Filed: Apr. 15, 2020

(65) Prior Publication Data

US 2021/0328135 A1  Oct. 21, 2021

(51) Int. Cl.
*H01L 43/10* (2006.01)
*H01L 27/22* (2006.01)
*H01L 43/08* (2006.01)
*H01L 43/02* (2006.01)

(52) U.S. Cl.
CPC ............ *H01L 43/10* (2013.01); *H01L 27/222* (2013.01); *H01L 43/02* (2013.01); *H01L 43/08* (2013.01)

(58) Field of Classification Search
CPC ......... H01L 43/10; H01L 43/02; H01L 43/08; H01L 27/222
See application file for complete search history.

(56) References Cited

U.S. PATENT DOCUMENTS

2006/0262594 A1* 11/2006 Fukumoto ............... G11C 11/16
   365/158
2010/0258886 A1* 10/2010 Wang .................... G11C 11/161
   257/E29.323
2014/0001586 A1* 1/2014 Shen ....................... H01L 43/10
   257/421

\* cited by examiner

*Primary Examiner* — Marc Anthony Armand
(74) *Attorney, Agent, or Firm* — Winston Hsu

(57) ABSTRACT

A storage layer of a magnetic tunnel junction (MTJ) element is disclosed. The storage layer having perpendicular magnetic anisotropy includes a first ferromagnetic layer, a first dust layer disposed directly on the first ferromagnetic layer, a second ferromagnetic layer disposed directly on the first dust layer, a second dust layer disposed directly on the second ferromagnetic layer, and a third ferromagnetic layer disposed directly on the second dust layer. A material of the first dust layer is different from a material of the second dust layer.

28 Claims, 3 Drawing Sheets

ASYMMETRIC ENGINEERED STORAGE LAYER OF MAGNETIC TUNNEL JUNCTION ELEMENT FOR MAGNETIC MEMORY DEVICE

BACKGROUND OF THE INVENTION

1. Field of the Invention

The invention relates to a magnetic memory device, and more particularly, to an improved storage layer of a magnetic tunnel junction (MTJ) element in a magnetoresistive random access memory (MRAM) device.

2. Description of the Prior Art

Magnetoresistive random access memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

A MTJ element is based on tunnel magneto-resistance (TMR) effect wherein a stack of layers has a configuration in which two ferromagnetic layers are separated by a thin non-magnetic dielectric layer or tunnel barrier layer. If the tunnel barrier layer is thin enough (typically a few angstroms to a few nanometers), electrons can tunnel from one ferromagnet into the other. In a MRAM device, the MTJ element is typically formed between a bottom electrode and a top electrode. A MTJ stack of layers that is subsequently patterned to form a MTJ element may be formed by sequentially depositing a seed layer, a reference layer formed by two reference-pinned layers antiferromagnetically coupled with each other and a polarization-enhancement layer (PEL) between one reference-pinned layer and the tunnel barrier layer, a thin tunnel barrier layer, a ferromagnetic "free" layer or storage layer, and a capping layer.

It is desirable to provide an improved storage layer of a MTJ element in a magnetic memory device, which is able to provide high perpendicular magnetic anisotropy (PMA), low damping, higher spin transfer torque (STT) efficiency, smaller distribution of coercivity (Hc) and/or critical voltage (Vc), and high TMR ratio.

Among all PMA ferromagnet so far developed, the CoFeB ultra-thin film in contact with an oxide, e.g. MgO and a heavy metal, e.g. Ta, W, is insensitively used as free layer. To improve the thermal stability, thicker CoFeB with both sides in contact with MgO with an ultra-thin heavy metal inserted in was employed as free layer. However, this type of design causes unavoidable disadvantages, such as thicker heavy metal doping layer benefit for PMA and thermal stability but harm for damping and MR ratio; thicker ferromagnetic material benefit for retention and MR, but causes the increase in distribution of magnetic and electric parameters, e.g. Hc and switching voltage.

SUMMARY OF THE INVENTION

It is one object to provide an improved storage layer having perpendicular magnetic anisotropy of a magnetic tunnel junction (MTJ) element to solve the shortcomings or disadvantages of the above-mentioned prior art.

One aspect of the invention provides a storage layer of a MTJ element, including a first ferromagnetic layer, a first dust layer disposed directly on the first ferromagnetic layer, a second ferromagnetic layer disposed directly on the first dust layer, a second dust layer disposed directly on the second ferromagnetic layer, and a third ferromagnetic layer disposed directly on the second dust layer.

According to some embodiments, the storage layer further includes a capping oxide layer disposed directly on the third ferromagnetic layer.

According to some embodiments, the capping oxide layer comprises MgO. The capping oxide layer is not limited to MgO. The capping oxide layer may comprise AlOx, TiOx, HfOx, MgAlOx, MgZnOx, SiOx, TaOx, VOx, or any combination thereof. The capping oxide layer may have a thickness of 5 to 30 angstroms.

According to some embodiments, the first ferromagnetic layer is disposed directly on a tunnel barrier layer.

According to some embodiments, the tunnel barrier layer comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the first ferromagnetic layer has one surface that forms an interface with the tunnel barrier layer to obtain perpendicular magnetic anisotropy.

According to some embodiments, the first ferromagnetic layer, the second ferromagnetic layer and the third ferromagnetic layer are comprised of Fe-rich alloys or magnetic multilayer.

According to some embodiments, the first ferromagnetic layer, the second ferromagnetic layer and the third ferromagnetic layer are made of at least one of the following materials with a thickness of 0 to 30 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, the first dust layer comprises a first non-magnetic metal layer.

According to some embodiments, the first non-magnetic metal layer comprises Ta, W, Mo, Nb, Mg, Al, C, V, Hf, Ir, Rh, Zr, Cr, Bi, or combinations thereof.

According to some embodiments, the second dust layer comprises a second non-magnetic metal layer.

According to some embodiments, the second non-magnetic metal layer comprises Ta, W, Mo, Nb, Mg, Al, C, V, Hf, Ir, Rh, Zr, Cr, Bi, or combinations thereof.

According to some embodiments, a material of the first dust layer is different from a material of the second dust layer.

According to some embodiments, the first dust layer is capable of enhancing MR and/or retention of the MTJ element, and the second dust layer is composed of a metal that is capable of improving He and/or Vc distribution of the MTJ element.

According to some embodiments, the first dust layer and the second dust layer have a thickness ranging between 0.1 angstroms and 5 angstroms.

Another aspect of the invention provides a magnetic memory device including a bottom electrode, a top electrode; and a magnetic tunnel junction (MTJ) element interposed between the bottom electrode and the top electrode. The MTJ element comprises a reference layer, a tunnel barrier layer, and a storage layer. The storage layer comprises a first ferromagnetic layer; a first dust layer disposed directly on the first ferromagnetic layer; a second ferromagnetic layer disposed directly on the first dust layer; a second dust layer disposed directly on the second ferromagnetic layer; and a third ferromagnetic layer disposed directly on the second dust layer.

According to some embodiments, the magnetic memory device further includes a capping oxide layer disposed directly on the third ferromagnetic layer.

According to some embodiments, the capping oxide layer comprises MgO. The capping oxide layer is not limited to MgO. The capping oxide layer may comprise AlOx, TiOx, HfOx, MgAlOx, MgZnOx, SiOx, TaOx VOx, or any combination thereof. The capping oxide layer may have a thickness of 5 to 30 angstroms.

According to some embodiments, the first ferromagnetic layer is disposed directly on the tunnel barrier layer.

According to some embodiments, the tunnel barrier layer comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the first ferromagnetic layer has one surface that forms an interface with the tunnel barrier layer to obtain perpendicular magnetic anisotropy.

According to some embodiments, the first ferromagnetic layer, the second ferromagnetic layer and the third ferromagnetic layer are comprised of Fe-rich alloys or magnetic multilayer.

According to some embodiments, the first ferromagnetic layer, the second ferromagnetic layer and the third ferromagnetic layer are made of at least one of the following materials with thickness of 0 to 30 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, the first dust layer comprises a first non-magnetic metal layer.

According to some embodiments, the first non-magnetic metal layer comprises Ta, W, Mo, Nb, Mg, Al, C, V, Hf, Ir, Rh, Zr, Cr, Bi, or combinations thereof.

According to some embodiments, the second dust layer comprises a second non-magnetic metal layer.

According to some embodiments, the second non-magnetic metal layer comprises Ta, W, Mo, Nb, Mg, Al, C, V, Hf, Ir, Rh, Zr, Cr, Bi, or combinations thereof.

According to some embodiments, a material of the first dust layer is different from a material of the second dust layer.

According to some embodiments, the first dust layer is capable of enhancing MR and retention of the MTJ element, and the second dust layer is composed of a metal that is capable of improving He and/or Vc distribution of the MTJ element.

According to some embodiments, the first dust layer and the second dust layer have a thickness ranging between 0.1 angstroms and 5 angstroms.

According to some embodiments, the reference layer is comprised of RL_PL1|AFC-spacer|RL_PL2|metal-spacer-|PEL, wherein RL_PL1 and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

Here the asymmetric doping method in the storage layer (or free layer "FL") introduced different engineer of the FL by different selection of the free layer. The STT switching efficiency and distribution can be greatly improved. This makes the asymmetric engineer design fundamentally different from the previous designs, and therefore the device performance can be greatly improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
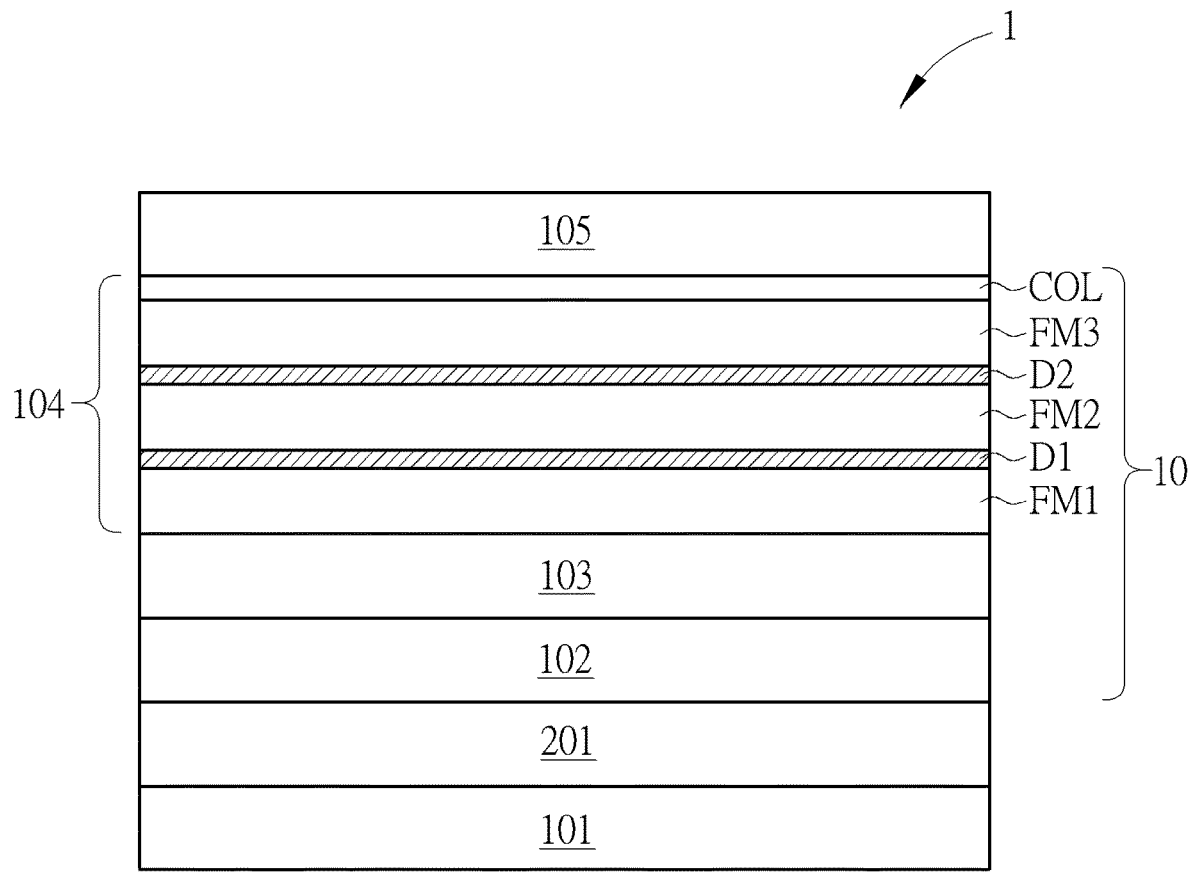
FIG. 1 is a cross-sectional diagram showing an exemplary magnetic memory device having an improved storage layer of a MTJ element according to an embodiment.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to an improved storage layer disposed between a tunnel barrier layer and a capping oxide layer of a magnetic tunnel junction (MTJ) element in a magnetic memory device. For example, the storage layer may be comprised of a stack structure with the sequence of FM1/D1/FM2/D2/FM3, wherein FM1 is a first ferromagnetic layer, D1 is a first dust layer for enhancing magnetoresistance (MR) and/or perpendicular anisotropy energy (Ku) (or also referred to as "MR/Ku enhancement layer"), FM2 is a second ferromagnetic layer, D2 is a second dust layer for enhancing He and/or Vc distribution (or also referred to as "Hc and Vc distribution enhancement layer"), and FM3 is a third ferromagnetic layer.

The first dust layer D1 and the second dust layer D2 are composed of different nonmagnetic materials, which may incorporate different properties into the storage layer. For example, the chosen elements for the first dust layer D1 may benefit from higher Ku (but may still cause larger distribution on He and Vc), while the chosen elements for the second dust layer D2 may benefit from higher STT switching efficiency (but may cause degradation of MR and Ku). By combining different flavors of the chosen elements in the first and second dust layers, an asymmetric tailored storage layer can fulfill the disclosed storage layer when employed in a MTJ element of a magnetic memory device (e.g., MRAM) that is able to exhibit higher MR, controllable or tunable Ku, higher STT efficiency, and smaller He and Vc distribution.

FIG. 1 is a schematic, cross-sectional diagram showing an exemplary magnetic memory device having an improved storage layer of a MTJ element according to an embodiment. As shown in FIG. 1, the MRAM device 1 comprises a MTJ element 10 sandwiched between a bottom electrode 101 and a top electrode 105. The MTJ element 10 may be comprised of a reference layer 102 over a top surface of the bottom electrode 101, a tunnel barrier layer 103 on the reference layer 102, and a storage layer 104 contacting a lower surface of the top electrode 105. The tunnel barrier layer 103 is interposed between the reference layer 102 and the storage layer 104.

According to an exemplary embodiment, a seed layer 201 may be interposed between the bottom electrode 101 and the reference layer 102. For example, the seed layer 201 may comprise Pt, Ta, Ru, Cr, or combinations thereof, but is not limited thereto. In an embodiment, the seed layer 201 may be grown on a bottom electrode with an amorphous Ta capping layer, but is not limited thereto.

According to some embodiments, the reference layer is comprised of RL_PL1|AFC-spacer|RL_PL2|metal-spacer-|PEL, wherein RL_PL1 and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to an exemplary embodiment, the tunnel barrier layer 103 may comprise an insulator, including but not limited to MgO. The tunnel barrier layer 103 is not limited to MgO. In some embodiments, the tunnel barrier layer 103 may comprise AlOx, TiOx, HfOx, MgAlOx, MgZnOx, TaOx, VOx, or any combination thereof. The tunnel barrier layer 103 may have a thickness of 5 to 30 angstroms.

According to an exemplary embodiment, the storage layer 104 may be a multi-layered stack having a thickness of about 10-50 angstroms, for example, 20 angstroms. For example, the storage layer 104 may comprise a first ferromagnetic layer FM1 disposed directly on the tunnel barrier layer 103, a first dust layer D1 disposed directly on the first ferromagnetic layer FM1, a second ferromagnetic layer FM2 disposed directly on the first dust layer D1, a second dust layer D2 disposed directly on the second ferromagnetic layer FM2, a third ferromagnetic layer FM3 disposed directly on the second dust layer D2, and a capping oxide layer COL disposed directly on the third ferromagnetic layer FM3 and directly contacting a lower surface of the top electrode 105. According to an exemplary embodiment, for example, the capping oxide layer COL may comprise MgO. The capping oxide layer COL is not limited to MgO. In some embodiments, the capping oxide layer COL may comprise AlOx, TiOx, HfOx, MgAlOx, MgZnOx, SiOx, TaOx and VOx, or any combination thereof. The capping oxide layer COL may have a thickness of 5 to 30 angstroms.

According to an exemplary embodiment, the first ferromagnetic layer FM1, the second ferromagnetic layer FM2 and the third ferromagnetic layer FM3 may be comprised of Fe-rich alloys or magnetic multilayer. The first ferromagnetic layer FM1 has one surface that forms an interface with the tunnel barrier layer 103 to obtain perpendicular magnetic anisotropy. The third ferromagnetic layer FM3 has one surface that forms an interface with the capping oxide layer COL to obtain perpendicular magnetic anisotropy.

For example, the first ferromagnetic layer FM1, the second ferromagnetic layer FM2 and the third ferromagnetic layer FM3 may be made of at least one of the following materials: Fe, CoFe, CoFeB, CoFeAl, CoMnSi, CoPt, FePt, CoPd, FePd, TeFeCo, GdCo, MnGa, MnGe, MnAl, MnSi or combinations thereof. The thickness of the first ferromagnetic layer FM1 may range from 5 angstroms to 20 angstroms. The thickness of the second ferromagnetic layer FM2 may range from 0 angstrom to 10 angstroms. The thickness of the third ferromagnetic layer FM3 may range from 1 angstrom to 10 angstroms.

The first dust layer D1 is sandwiched by the first ferromagnetic layer FM1 and the second ferromagnetic layer FM2. According to an exemplary embodiment, the first dust layer D1 may comprise a non-magnetic metal layer, which may be made of at least one of the following materials: Ta, W, Mo, Nb, Mg, Al, C, V, Hf, Ir, Rh, Zr, Cr, Bi, and/or combinations thereof. According to an exemplary embodiment, the thickness of the first dust layer D1 may range between 0.5 angstroms and 5 angstroms, for example, 1 angstrom. The second dust layer D2 is sandwiched by the second ferromagnetic layer FM2 and the third ferromagnetic layer FM3. According to an exemplary embodiment, the second dust layer D2 may comprise a non-magnetic metal layer, which may be made of at least one of the following materials: Ta, W, Mo, Nb, Mg, Al, C, V, Hf, Ir, Rh, Zr, Cr, Bi, and/or combinations thereof. According to an exemplary embodiment, the thickness of the second dust layer D2 may range between 0.1 angstroms and 5 angstroms, for example, 1 angstrom.

According to an exemplary embodiment, the material of the first dust layer D1 may be different from the material of the second dust layer D2. For example, the first dust layer D1 may be composed of a metal such as W (having body-centered cubic (bcc) structure same as that of MgO), which is capable of enhancing MR and/or retention of the MTJ element 10, and the second dust layer D2 may be composed of a metal such as Ta or Mo, which is capable of enhancing He and/or Vc distribution of the MTJ element 10, thereby providing higher MR, controllable Ku, higher STT efficiency, and smaller He and Vc distribution.

Figure 3:
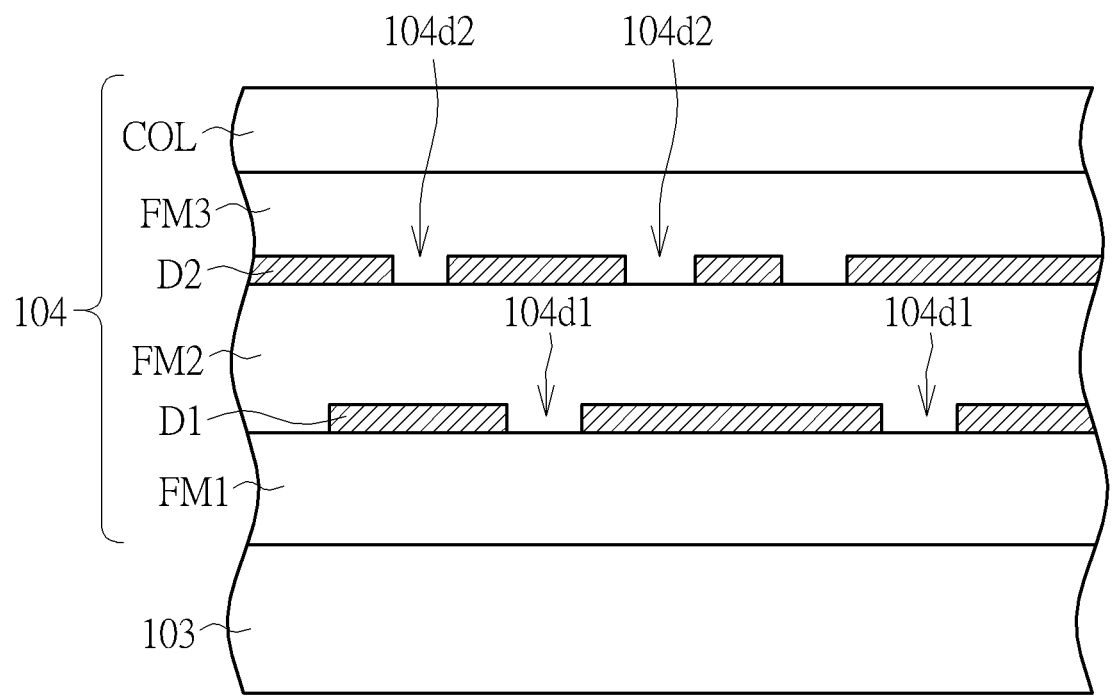
FIG. 3 is a cross-sectional diagram showing an exemplary magnetic memory device having discontinuous dust layers of a MTJ element according to another embodiment.

According to an exemplary embodiment, as shown in FIG. 3, the first dust layer D1 may be a discontinuous layer. Since the first dust layer D1 is discontinuous, the second ferromagnetic layer FM2 may be in direct contact with the first ferromagnetic layer FM1 within the discontinuity regions 104d1. According to an exemplary embodiment, the second dust layer D2 may be a discontinuous layer. Since the second dust layer D2 is discontinuous, the third ferromagnetic layer FM3 may be in direct contact with the second ferromagnetic layer FM2 within the discontinuity regions 104d2.

Figure 2:
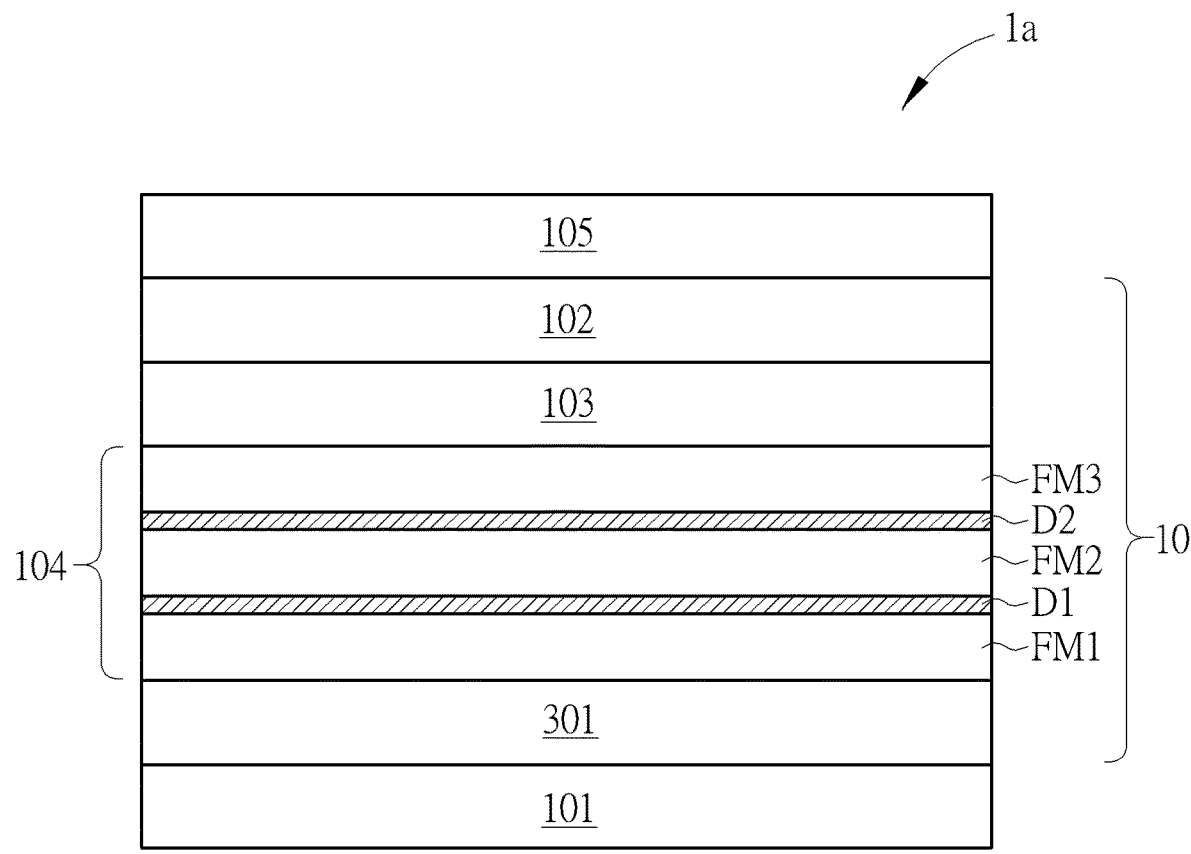
FIG. 2 is a cross-sectional diagram showing an exemplary magnetic memory device having an improved storage layer of a MTJ element according to another embodiment.

FIG. 2 is a schematic, cross-sectional diagram showing an exemplary magnetic memory device having an improved storage layer of a MTJ element according to another embodiment, wherein like numeral numbers designate like regions, layers or elements. As shown in FIG. 2, the magnetic memory device 1a comprises a MTJ element 10 sandwiched between a bottom electrode 101 and a top electrode 105. The MTJ element 10 comprises a storage layer 104 disposed on a seed layer 301, a tunnel barrier layer 103 on the storage layer 104, and a reference layer 102 disposed on the tunnel barrier layer 103 and contacting a lower surface of the top electrode 105. The tunnel barrier layer 103 is interposed between the reference layer 102 and the storage layer 104. According to an exemplary embodiment, for example, the seed layer 301 may comprise MgO, but is not limited thereto.

According to some embodiments, the reference layer is comprised of RL_PL1|AFC-spacer|RL_PL2|metal-spacer-|PEL, wherein RL_PL1 and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to an exemplary embodiment, the tunnel barrier layer 103 may comprise an insulator, including but not limited to MgO. According to one embodiment, the tunnel barrier layer 103 may have a thickness of about 5~50 angstroms.

According to an exemplary embodiment, the storage layer 104 may be a multi-layered stack having a thickness of about 10-50 angstroms, for example, 20 angstroms. For example, the storage layer 104 may comprise a first ferromagnetic layer FM1 disposed directly on the tunnel barrier layer 103, a first dust layer D1 disposed directly on the first ferromagnetic layer FM1, a second ferromagnetic layer FM2 disposed directly on the first dust layer D1, a second dust layer D2 disposed directly on the second ferromagnetic layer FM2, and a third ferromagnetic layer FM3 disposed directly on the second dust layer D2 and directly contacting a lower surface of the tunnel barrier layer 103.

According to an exemplary embodiment, the first ferromagnetic layer FM1, the second ferromagnetic layer FM2 and the third ferromagnetic layer FM3 may be comprised of Fe-rich alloys or magnetic multilayer. The first ferromagnetic layer FM1 has one surface that forms an interface with the seed layer 301 to obtain perpendicular magnetic anisotropy. The third ferromagnetic layer FM3 has one surface that forms an interface with the tunnel barrier layer 103 to obtain perpendicular magnetic anisotropy.

For example, the first ferromagnetic layer FM1, the second ferromagnetic layer FM2 and the third ferromagnetic layer FM3 may be made of at least one of the following materials with thickness of 0 to 30 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof. The thickness of the first ferromagnetic layer FM1 may range from 5 angstrom to 20 angstroms. The thickness of the second ferromagnetic layer FM2 may range from 0 angstrom to 10 angstroms. The thickness of the third ferromagnetic layer FM3 may range from 1 angstrom to 10 angstroms.

The first dust layer D1 is sandwiched by the first ferromagnetic layer FM1 and the second ferromagnetic layer FM2. According to an exemplary embodiment, the first dust layer D1 may comprise a non-magnetic metal layer, which may be made of at least one of the following materials: Ta, W, Mo, Nb, Mg, Al, C, V, Hf, Ir, Rh, Zr, Cr, Bi, and/or combinations thereof. According to an exemplary embodiment, the thickness of the non-magnetic layer may range between 0.1 angstroms and 5 angstroms, for example, 1 angstrom. The second dust layer D2 is sandwiched by the second ferromagnetic layer FM2 and the third ferromagnetic layer FM3. According to an exemplary embodiment, the second dust layer D2 may comprise a non-magnetic metal layer, which may be made of at least one of the following materials: Ta, W, Mo, Nb, Mg, Al, C, V, Hf, Ir, Rh, Zr, Cr, Bi, and/or combinations thereof. According to an exemplary embodiment, the thickness of the non-magnetic layer may range between 0.1 angstroms and 5 angstroms, for example, 1 angstrom.

According to an exemplary embodiment, the material of the first dust layer D1 may be different from the material of the second dust layer D2, thereby forming asymmetrically engineered reference layer structure. For example, the first dust layer D1 may be composed of a metal such as W (having body-centered cubic (bcc) structure same as that of MgO), which is capable of enhancing MR and retention of the MTJ element 10, and the second dust layer D2 may be composed of a metal such as Ta or Mo, which is capable of enhancing He and/or Vc distribution of the MTJ element 10, thereby providing higher MR, controllable Ku, higher STT efficiency, and smaller He and Vc distribution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A storage layer of a magnetic tunnel junction (MTJ) element, comprising:
    a first ferromagnetic layer;
    a first dust layer disposed directly on the first ferromagnetic layer, wherein the first dust layer is a discontinuous layer and has a thickness of about 1 angstrom;
    a second ferromagnetic layer disposed directly on the first dust layer, wherein the second ferromagnetic layer is in direct contact with the first ferromagnetic layer within a discontinuity region in the first dust layer;
    a second dust layer disposed directly on the second ferromagnetic layer, wherein a material of the first dust layer is different from a material of the second dust layer; and
    a third ferromagnetic layer disposed directly on the second dust layer.

2. The storage layer according to claim 1 further comprising:
    a capping oxide layer disposed directly on the third ferromagnetic layer.

3. The storage layer according to claim 2, wherein the capping oxide layer comprises MgO.

4. The storage layer according to claim 1, wherein the first ferromagnetic layer is disposed directly on a tunnel barrier layer.

5. The storage layer according to claim 4, wherein the tunnel barrier layer comprises MgO.

6. The storage layer according to claim 4, wherein the first ferromagnetic layer has one surface that forms an interface with the tunnel barrier layer to obtain perpendicular magnetic anisotropy.

7. The storage layer according to claim 1, wherein the first ferromagnetic layer, the second ferromagnetic layer and the third ferromagnetic layer are comprised of Fe-rich alloys or magnetic multilayer.

8. The storage layer according to claim 1, wherein the first ferromagnetic layer, the second ferromagnetic layer and the third ferromagnetic layer are made of at least one of the following materials: Fe, CoFe, CoFeB, CoFeAl, CoMnSi, CoPt, FePt, CoPd, FePd, TeFeCo, GdCo, MnGa, MnGe, MnAl, MnSi, or combinations thereof.

9. The storage layer according to claim 1, wherein the first dust layer comprises a first non-magnetic metal layer.

10. The storage layer according to claim 9, wherein the first non-magnetic metal layer comprises Ta, W, Mo, Nb, Mg, Al, C, V, Hf, Ir, Rh, Zr, Cr, Bi, or combinations thereof.

11. The storage layer according to claim 10, wherein the second dust layer comprises a second non-magnetic metal layer.

12. The storage layer according to claim 11 wherein the second non-magnetic metal layer comprises Ta, W, Mo, Nb, Mg, Al, C, V, Hf, Ir, Rh, Zr, Cr, Bi, or combinations thereof.

13. The storage layer according to claim 1 wherein the first dust layer is composed of a metal having body-centered cubic (bcc) structure same as that of MgO, which is capable of enhancing MR and/or retention of the MTJ element, and the second dust layer is composed of a metal that is capable of enhancing He and/or Vc distribution of the MTJ element.

14. The storage layer according to claim 1 wherein the second dust layer has a thickness ranging between 0.1 angstroms and 5 angstroms.

15. A magnetic memory device, comprising:
    a bottom electrode;
    a top electrode; and
    a magnetic tunnel junction (MTJ) element interposed between the bottom electrode and the top electrode, wherein the MTJ element comprises a reference layer, a tunnel barrier layer, and a storage layer, wherein the storage layer comprises a first ferromagnetic layer; a first dust layer disposed directly on the first ferromagnetic layer; a second ferromagnetic layer disposed directly on the first dust layer; a second dust layer disposed directly on the second ferromagnetic layer; and a third ferromagnetic layer disposed directly on the second dust layer, wherein the first dust layer is a discontinuous layer and has a thickness of about 1 angstrom, and wherein a material of the first dust layer is different from a material of the second dust layer, wherein the second ferromagnetic layer is in direct contact with the first ferromagnetic layer within a discontinuity region in the first dust layer.

16. The magnetic memory device according to claim 15 further comprising:
    a capping oxide layer disposed directly on the third ferromagnetic layer.

17. The magnetic memory device according to claim 16, wherein the capping oxide layer comprises MgO.

18. The magnetic memory device according to claim 15, wherein the first ferromagnetic layer is disposed directly on the tunnel barrier layer.

19. The magnetic memory device according to claim 18, wherein the tunnel barrier layer comprises MgO.

20. The magnetic memory device according to claim 19, wherein the first ferromagnetic layer has one surface that forms an interface with the tunnel barrier layer to obtain perpendicular magnetic anisotropy.

21. The magnetic memory device according to claim 15, wherein the first ferromagnetic layer, the second ferromagnetic layer and the third ferromagnetic layer are comprised of Fe-rich alloys or magnetic multilayer.

22. The magnetic memory device according to claim 15, wherein the first ferromagnetic layer, the second ferromagnetic layer and the third ferromagnetic layer are made of at least one of the following materials: Fe, CoFe, CoFeB, CoFeAl, CoMnSi, CoPt, FePt, CoPd, FePd, TeFeCo, GdCo, MnGa, MnGe, MnAl, MnSi, or combinations thereof.

23. The magnetic memory device according to claim 15, wherein the first dust layer comprises a first non-magnetic metal layer.

24. The magnetic memory device according to claim 23, wherein the first non-magnetic metal layer comprises Ta, W, Mo, Nb, Mg, Al, C, V, Hf, Ir, Rh, Zr, Cr, Bi, or combinations thereof.

25. The magnetic memory device according to claim 24, wherein the second dust layer comprises a second non-magnetic metal layer.

26. The magnetic memory device according to claim 25, wherein the second non-magnetic metal layer comprises Ta, W, Mo, Nb, Mg, Al, C, V, Hf, Ir, Rh, Zr, Cr, Bi, or combinations thereof.

27. The magnetic memory device according to claim 15 wherein the first dust layer is composed of a metal having body-centered cubic (bcc) structure same as that of MgO, which is capable of enhancing MR and/or retention of the MTJ element, and the second dust layer is composed of a metal that is capable of enhancing Hc and/or Vc distribution of the MTJ element.

28. The magnetic memory device according to claim 15 wherein the second dust layer has a thickness ranging between 0.1 angstroms and 5 angstroms.

* * * * *